United States Patent [19]

Azar

[11] Patent Number: 5,103,374
[45] Date of Patent: Apr. 7, 1992

[54] CIRCUIT PACK COOLING USING TURBULATORS

[75] Inventor: Kaveh Azar, Westwood, Mass.

[73] Assignee: AT&T Bell Laboratories, Murray Hill, N.J.

[21] Appl. No.: 527,602

[22] Filed: May 23, 1990

[51] Int. Cl.⁵ .............................................. H05K 7/20
[52] U.S. Cl. .................... 361/382; 165/80.3; 361/383; 361/385
[58] Field of Search ................. 165/80.3, 80.4, 104.33, 165/122; 357/81, 82; 361/381-386, 388

[56] References Cited

U.S. PATENT DOCUMENTS 3,524,497  8/1970  Chu et al. ............... 361/385
3,527,989  9/1970  Cuzner et al. ........... 361/381

*Primary Examiner*—Gregory D. Thompson
*Attorney, Agent, or Firm*—L. H. Birnbaum

[57] ABSTRACT

Disclosed is a fluid-cooled circuit pack which includes heat generating components on a front surface of a circuit board and another surface opposite to the front surface to create a channel for the flow of cooling fluid over the components. An array of rods, or turbulators, are provided on the surface opposite the printed circuit board front surface to create disturbances in the fluid flow and enhance heat transfer.

10 Claims, 4 Drawing Sheets

CIRCUIT PACK COOLING USING TURBULATORS

FIELD OF THE INVENTION

This invention relates to forced fluid cooling of electronic circuit packs.

BACKGROUND OF THE INVENTION

The density of heat generating components in electronic circuit packs continues to rise as it has for decades. The requirement for forced fluid cooling is therefore already present in many current electronic systems. Proposed systems for more effective cooling are, in general, complicated and expensive. Such proposals include, for example, the use of compressed fluorinated hydrocarbons, other gases and liquids such as water, which can be difficult to implement.

It is generally recognized that rods placed on one or more of the principal walls of a flow passage will enhance heat transfer through that passage (see Sparrow et al, "Symmetric vs. Asymmetric Periodic Disturbances at the Walls of a Heated Flow Passage," International Journal Heat Mass Transfer, Volume 27, pp. 2133-2144 (1984), and Sparrow et al, "Enhanced Heat Transfer in a Flat Rectangular Duct . . . ", Journal of Heat Transfer, Volume 105, pp. 851-861 (November 1983)). It has also been proposed to provide baffles and air flow guides to control the flow of cooling air over a matrix of integrated circuit components including heat sinks (see U.S. Pat. No. 4,233,644 issued to Hwang et al).

One of the problems associated with forced fluid cooling of circuit packs is that the fluid, typically air, tends to stagnate in the areas between the components, and cooling efficiency suffers thereby. The prior art proposals do not appear to address this problem.

It is, therefore, an object of the invention to provide an inexpensive means for forced fluid cooling of circuit packs.

SUMMARY OF THE INVENTION

This and other objects are achieved in accordance with the invention, which is a fluid-cooled circuit pack comprising a circuit board having a front surface with at least one heat generating component mounted thereon. Another surface is disposed opposite to the front surface and in a spaced relationship thereto so as to form a channel for the flow of cooling fluid over the component. An array of rods is mounted to the opposite surface in a direction essentially perpendicular to the intended direction of the cooling fluid and extending sufficiently into the channel to create disturbances in the flow of cooling fluid.

BRIEF DESCRIPTION OF THE DRAWING

These and other features of the invention are delineated in detail in the following description. In the drawing.

DETAILED DESCRIPTION

Figure 1:
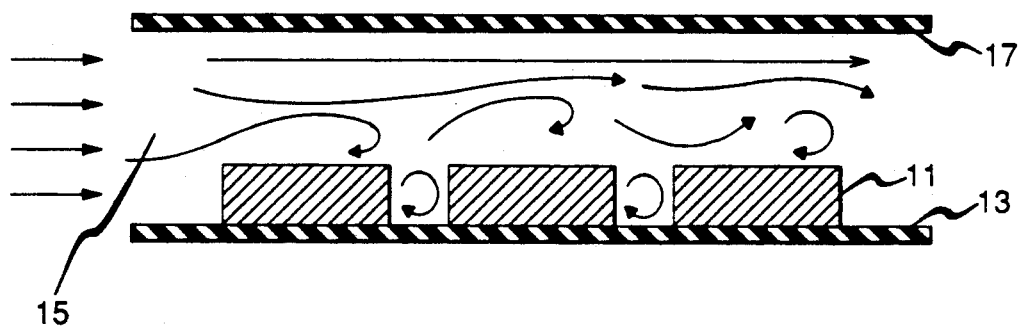
FIG. 1 is a cross-sectional view of a typical circuit pack and its cooling channel according to the prior art.

In a typical forced fluid circuit pack cooling system of the prior art as shown in FIG. 1, circuit pack components 11 are mounted in a regular or irregular array on a board 13. Forced cooling fluid, which in most cases is air driven by a fan, is constricted to pass over the components in a channel 15 formed between circuit board 13 and a facing wall 17. Wall 17 may be the back of an adjacent circuit pack, the cabinet housing the equipment, or even a baffle inserted to direct the fluid flow. An analysis of the fluid flow through this type of channel, as generally illustrated by the arrows, reveals that the fluid surrounding the components tends to be stagnant, or at best, recirculating with minimum exchange with midstream fluid which tends to be at a lower temperature. This observed flow phenomenon is not optimized.

Figure 2:
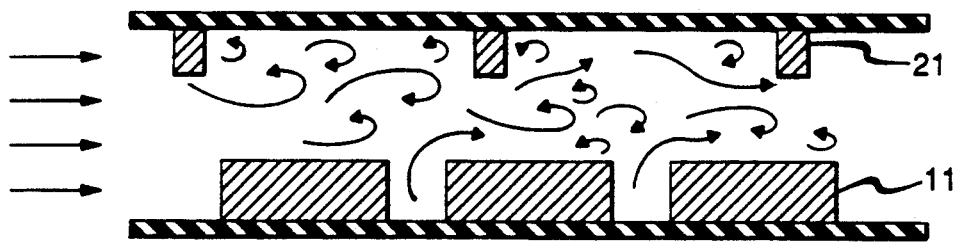
FIG. 2 is a cross-sectional view of a typical circuit pack having turbulators in the cooling channel according to the invention.

Major enhancement to cooling can be obtained by implementation of the invention as shown in FIG. 2. The cooling channel of FIG. 2 differs from that of FIG. 1 in that rods or, hereinafter, turbulators, 21, project into the channel from opposite wall 17. The effect of turbulators 21 is to create large-scale disturbances within the channel. These disturbances force air in between components 11 to break up stagnation area and also force the cooler air near board 17 down toward the components to improve the heat transfer characteristics. The result is a major reduction in component temperature at minimum cost and design implementation.

It has been determined that turbulators of equal height and width equaling at least one-fourth and less than three-fourths of the channel height tend to produce very effective results. Further, turbulators extending essentially the full length of the board 17 and spaced at equal intervals produce optimum results regardless of the spacing of the components. For most cases the spacing between turbulators will be 5 to 10 cm. While it is not necessary that the turbulators have sharp edges as shown in FIG. 2, these edges are most effective.

Figure 3:
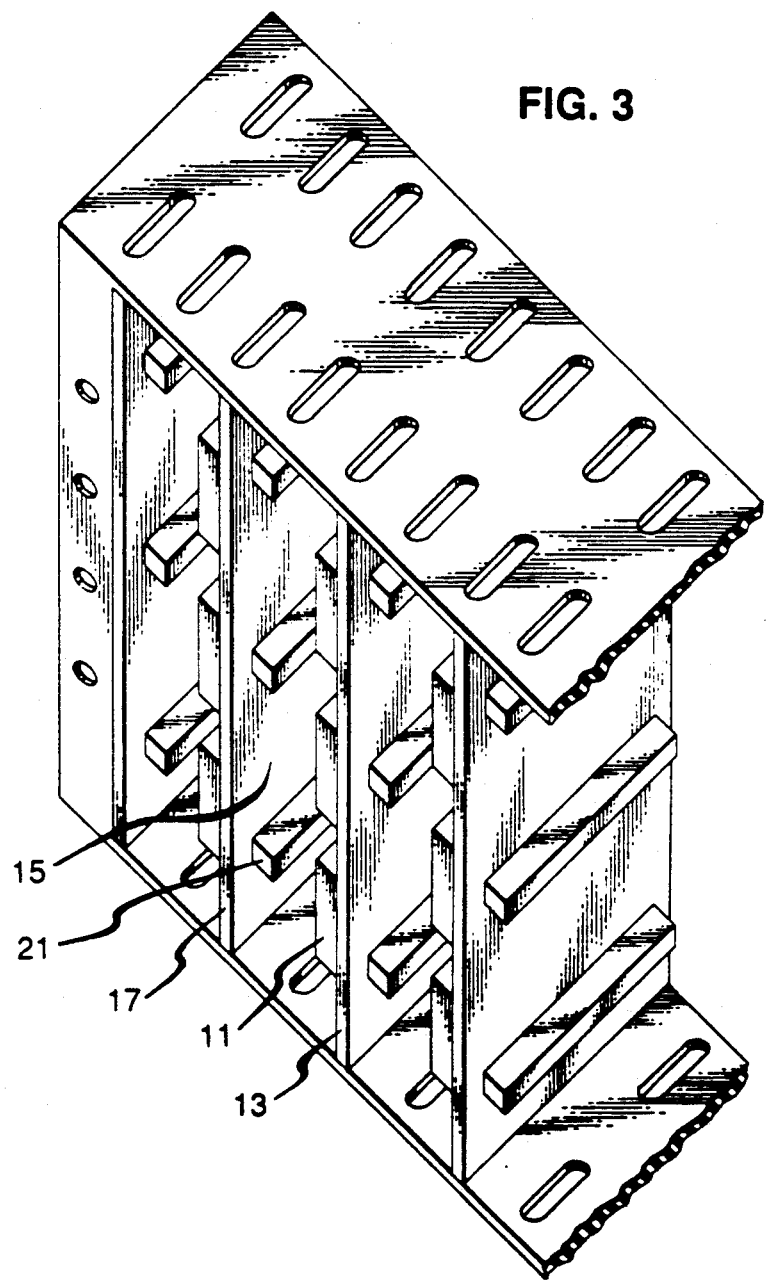
FIG. 3 is a three-dimensional view of the interior of a shelf of equipment with several circuit packs according to the invention.

A system having several circuit packs mounted on an equipment shelf and embodying the invention is shown in FIG. 3. In this arrangement a cooling channel 15 is formed between each set of adjacent circuit boards, e.g., 13 and 17. Turbulators 21 adjacent to the back side of each circuit board e.g., 17, enhance the cooling of the components 11 of the adjacent pack.

When circuit boards 13 have smooth back surfaces such as occurs with the use of surface-mounted components, turbulators 21 may be attached directly to the back surface as shown in FIG. 3 by well-known methods such as heat bonding, mechanical mounting and chemical bonding such as with epoxy cement. Alternatively, the board may be made such that the turbulators are an integral part of the board itself.

Figure 4:
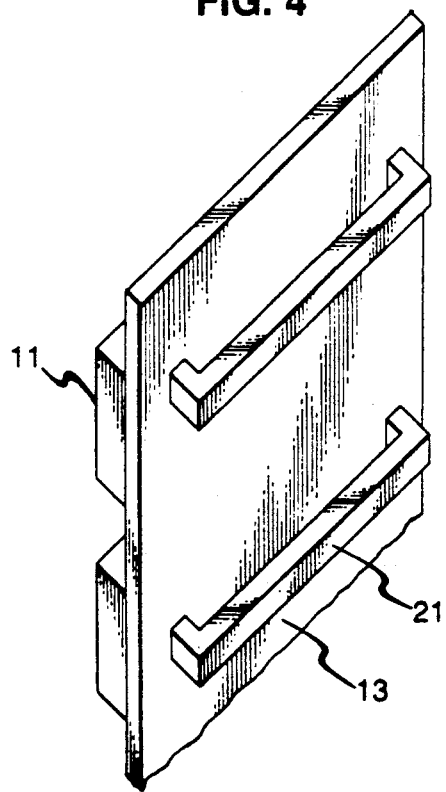
FIG. 4 is a three-dimensional view of a circuit board which is useful in practicing the invention.

When the back of the board is not smooth, as for instance when thru-hole mounting techniques are used, or the back surface is used for wiring paths, turbulators shaped as shown in FIG. 4 may be used. According to this embodiment, turbulators 21 are U-shaped and contact the board for mounting purposes only at the edges where smooth areas can be found.

Figure 5:
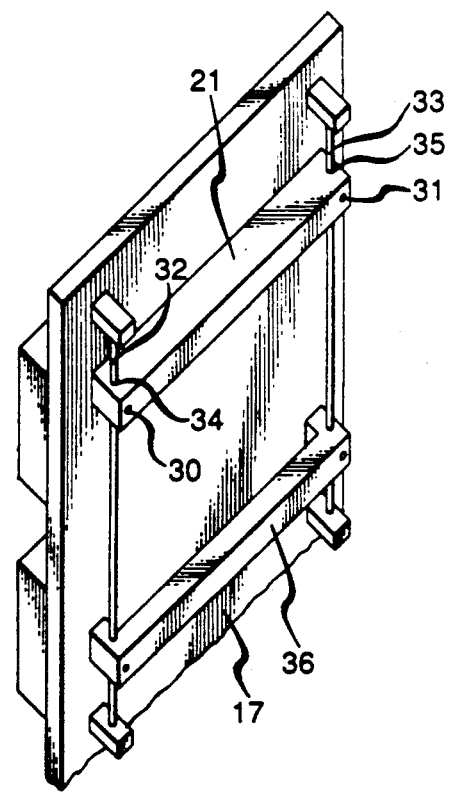
FIG. 5 is a three-dimensional view showing an alternate construction of a circuit pack according to the invention.

An alternative technique for mounting turbulators to provide the advantages of the invention is shown in FIG. 5. In this embodiment a turbulator 21 in the form of a rectangular solid has traverse holes with screws 30 and 31 therein. According to this embodiment, a pair of support rods 32 and 33 are mounted to the back of a circuit board 13 parallel to the direction of fluid flow. Each turbulator has traverse holes 34 and 35 which receive the support rods 32 and 33, respectively. Set screws 30 and 31 which intersect holes 34 and 35, respectively, may be used to lock turbulator in any position along rods 32 and 33. This construction allows adjustment of the spacing between turbulators to maximize the cooling effect, and thus can be very useful for a channel with unusual component layout. Where the back of the circuit board is not smooth, a turbulator, 36, which is U-shaped as previously described to provide clearance from the board irregularities, may be similarly mounted.

Figure 6:
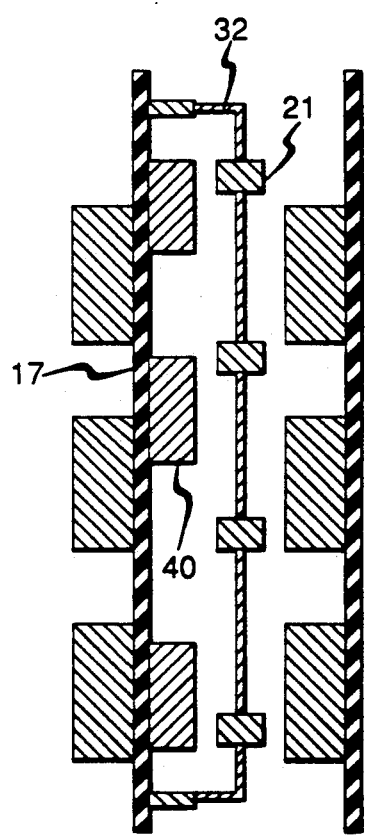
FIG. 6 is a cross-sectional view of a channel according to the invention in which components line both walls of the channel.

Finally, in a channel where components are mounted on both walls as shown in FIG. 6, the turbulators 21 are mounted on rods, e.g., 32, as before. Here, however, the rods extend a sufficient distance from the surface of the board 17 so as to provide clearance between the turbulators and the components 40 mounted on the back side of the board.

The turbulators can be made of any convenient material such as metal, wood, polymer or, in the case of being an integral part of the circuit board, glass epoxy.

Various additional modifications will become apparent to those skilled in the art. All such variations which basically rely on the teachings through which the invention has advanced the art are properly considered within the scope of the invention.

I claim:

1. A fluid-cooled circuit pack comprising:
   a circuit board having a front surface with an array of heat generating components mounted on said front surface;
   another surface disposed opposite to said front surface and in spaced relationship thereto so as to form a channel for the flow of cooling fluid over said components; and
   an array of rods mounted to said another surface in a direction essentially perpendicular to the intended direction of cooling fluid, each rod extending essentially the full length of the said another surface in a direction essentially perpendicular to the intended direction of the cooling fluid and extending sufficiently into said channel to create disturbances in the flow of cooling fluid while leaving a gap between the components and the rods in a direction essentially perpendicular to the said front surface and said another surface so as to force cooling fluid near the said another surface to the said front surface including the components and in between the components to break up stagnation areas.

2. The circuit pack according to claim 1 wherein the rods have sharp edges.

3. The circuit pack according to claim 1 wherein the height of the rods is at least one-fourth of the height of the channel.

4. The circuit pack according to claim 1 wherein the said another surface comprises a back surface of a second circuit board.

5. The circuit pack according to claim 4 wherein the rods are an integral part of said second circuit board.

6. The circuit board according to claim 1 wherein the rods are U-shaped to create a space between a part of each rod and the said another surface.

7. The circuit pack according to claim 1 wherein the rods are movably mounted to support rods which extend essentially perpendicular thereto to adjust the spacing of the rods.

8. The circuit pack according to claim 7 wherein the said another surface is a back surface of a second circuit board including components formed thereon, and the support rods are U-shaped to provide clearance between the rods and components on the second board.

9. The circuit pack according to claim 1 wherein there is an equal spacing between the rods in the array.

10. The circuit pack according to claim 9 wherein the spacing is within the range 5 to 10 cm.

* * * * *